United States Patent
Chae et al.

(10) Patent No.: US 12,348,128 B2
(45) Date of Patent: Jul. 1, 2025

(54) BATTERY SWITCH DRIVING CIRCUIT

(71) Applicant: LG INNOTEK CO., LTD., Seoul (KR)

(72) Inventors: Hyung Jun Chae, Seoul (KR); Ui Jong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 67 days.

(21) Appl. No.: 18/263,393

(22) PCT Filed: Jan. 24, 2022

(86) PCT No.: PCT/KR2022/001262
§ 371 (c)(1),
(2) Date: Jul. 28, 2023

(87) PCT Pub. No.: WO2022/164164
PCT Pub. Date: Aug. 4, 2022

(65) Prior Publication Data
US 2024/0137017 A1  Apr. 25, 2024

(30) Foreign Application Priority Data

Jan. 28, 2021 (KR) ........................ 10-2021-0012390

(51) Int. Cl.
*H02M 1/36* (2007.01)
*H02J 7/34* (2006.01)
*H03K 17/687* (2006.01)

(52) U.S. Cl.
CPC .............. *H02M 1/36* (2013.01); *H02J 7/342* (2020.01); *H02J 7/345* (2013.01); *H03K 17/687* (2013.01)

(58) Field of Classification Search
CPC .. H03K 17/687; H03K 17/689; H03K 17/691; H02J 7/342; H02J 7/345; H02M 1/32; H02M 1/36
See application file for complete search history.

(56) References Cited

U.S. PATENT DOCUMENTS

| | | | |
|---|---|---|---|
| 4,737,667 A | 4/1988 | Tihanyi | |
| 7,405,495 B2 * | 7/2008 | Guillarme | ........... H02M 3/1584 307/82 |

(Continued)

FOREIGN PATENT DOCUMENTS

| | | |
|---|---|---|
| CN | 106027013 A | 10/2016 |
| EP | 0 236 967 A1 | 9/1987 |

(Continued)

OTHER PUBLICATIONS

International Search Report dated May 10, 2022 in International Application No. PCT/KR2022/001262.

(Continued)

*Primary Examiner* — Patrick O Neill
(74) *Attorney, Agent, or Firm* — Saliwanchik, Lloyd & Eisenschenk

(57) ABSTRACT

A battery switch driving circuit according to an embodiment of the present invention comprises: a first battery input terminal and a second battery input terminal; a converter positioned between the first battery input terminal and the second battery input terminal; a first switch positioned between the second battery input terminal and the converter, so as to cut off a power input of the second battery input terminal when turned off; and a switch driving unit for turning on the first switch, wherein the switch driving unit comprises: a first capacitor which is charged or discharged according to on/off of a second switch operated by a PWM signal; and a second capacitor which is charged according to on/off of the second switch by a voltage charged in the first capacitor, so as to turn on the first switch.

16 Claims, 15 Drawing Sheets

(56) References Cited

U.S. PATENT DOCUMENTS 10,305,382 B2 * 5/2019 Abe .................. H02M 1/08
2017/0331369 A1 11/2017 Sugimoto et al.

FOREIGN PATENT DOCUMENTS

| EP | 3 048 712 A2 | 7/2016 |
| JP | H11353038 A | 12/1999 |
| JP | 2013055849 A | 3/2013 |
| JP | 2016140118 A | 8/2016 |
| KR | 10-2131582 B1 | 8/2020 |
| WO | 2020/127333 A1 | 6/2020 |

OTHER PUBLICATIONS

Supplementary European Search Report dated Nov. 4, 2024 in European Application No. 22746191.0.

* cited by examiner

PRIOR ART

BATTERY SWITCH DRIVING CIRCUIT

CROSS-REFERENCE TO RELATED APPLICATIONS

This application is the U.S. national stage application of International Patent Application No. PCT/KR2022/001262, filed Jan. 24, 2022, which claims the benefit under 35 U.S.C. § 119 of Korean Application No. 10-2021-0012390, filed Jan. 28, 2021, the disclosures of each of which are incorporated herein by reference in their entirety.

TECHNICAL FIELD

The present invention relates to a battery switch driving circuit, and more particularly, to a battery switch driving circuit for driving a battery switch using a switch, a capacitor, and a diode.

BACKGROUND ART

Recently, pluralities of batteries are used instead of a single battery, and battery application fields using a specific battery according to circumstances are increasing. For example, it is applied to various fields such as automobiles, automation devices, medical devices, and robots.

FIG. 1 is a system using a 48 V battery and a 12 V battery, and a 48 V battery can be charged using a 12 V battery or a 12 V battery can be charged using a 48 V battery through a DC-DC converter. In the case of using a 12 V battery, a semiconductor switch (FET, IGBT) may be used to disconnect and isolate the 48 V battery.

In order to turn on/off a semiconductor switch located on a high side, which is a high voltage, a high side switch driving unit for driving the semiconductor switch is required, as shown in FIG. 1, and the gate power of the semiconductor switch can be made with a push-pull method applying an isolation transformer, and the switch can be turned on with that power.

A circuit for driving such a high side semiconductor switch requires a buffer that amplifies a PWM signal and a transformer for isolation, and because of this, there are disadvantages in that product price increases and product size increases.

DETAILED DESCRIPTION OF THE INVENTION

Technical Subject

A technical problem to be solved by the present invention is to provide a battery switch driving circuit for driving a battery switch using a switch, a capacitor, and a diode.

Technical Solution

A battery switch driving circuit according to an embodiment of the present invention comprises: a first battery input terminal and a second battery input terminal; a converter positioned between the first battery input terminal and the second battery input terminal; a first switch positioned between the second battery input terminal and the converter, so as to cut off a power input of the second battery input terminal when turned off; and a switch driving unit for turning on the first switch, wherein the switch driving unit comprises: a first capacitor which is charged or discharged according to on/off of a second switch operated by a PWM signal; and a second capacitor which is charged according to on/off of the second switch by a voltage charged in the first capacitor, so as to turn on the first switch.

In addition, one end of the first capacitor is connected to the first battery input terminal and the other end thereof may be connected to the second switch.

In addition, the first capacitor may be connected to the first battery input terminal through a first resistor and a first diode.

In addition, one end of the first capacitor is connected to one end of the second capacitor and the other end thereof may be connected to the other end of the second capacitor.

In addition, the other end of the first capacitor is connected to the other end of the second capacitor through a second resistor and a second diode, and one end of the first capacitor may be connected to one end of the second capacitor through a third resistor and a third diode.

In addition, one end of the second capacitor is connected to the gate of the first switch and the other end thereof is connected to the source, and the first switch may be turned on when it is charged above a gate threshold value of the first switch.

In addition, one end of the first capacitor is connected to the system power input terminal or the second battery input terminal, and the other end thereof may be connected to the second switch.

In addition, when one end of the first capacitor is connected to the second battery input terminal, a clamping circuit for clamping a voltage being inputted from the second battery input terminal to a first battery voltage may be included.

In addition, it includes a third switch being connected to the first battery input terminal through an optocoupler and a fourth resistor and being turned on and off according to the first switch off signal, wherein the optocoupler forms a closed loop with the second capacitor, but it is operated when the third switch is turned on, so that the voltage of the second capacitor can be discharged.

In order to solve the above technical problem, a battery switch driving circuit according to another embodiment of the present invention comprises: a first battery input terminal; a second battery input terminal having a different battery voltage from the first battery input terminal; a converter positioned between the first battery input terminal and the second battery input terminal; a fourth switch and a fifth switch positioned between the second battery input terminal and the converter to block power input in opposite directions when turned off; and a switch driving unit for turning on the fourth switch and the fifth switch, wherein the switch driving unit includes a first capacitor being charged and discharged according to the on/off of the second switch being operated with a PWM signal; and a second capacitor being charged according to the on/off of the second switch by the voltage being charged in the first capacitor to turn on the fourth switch or the fifth switch.

Advantageous Effects

According to embodiments of the present invention, driving a semiconductor switch using a switch, a capacitor, and a diode is advantageous in terms of price and size. In addition, it can be configured in a back-to-back configuration, and the switch can be turned off quickly when necessary.

BEST MODE

Hereinafter, preferred embodiments of the present invention will be described in detail with reference to the accompanying drawings.

However, the technical idea of the present invention is not limited to some embodiments to be described, but may be implemented in various forms, and inside the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Figure 1:
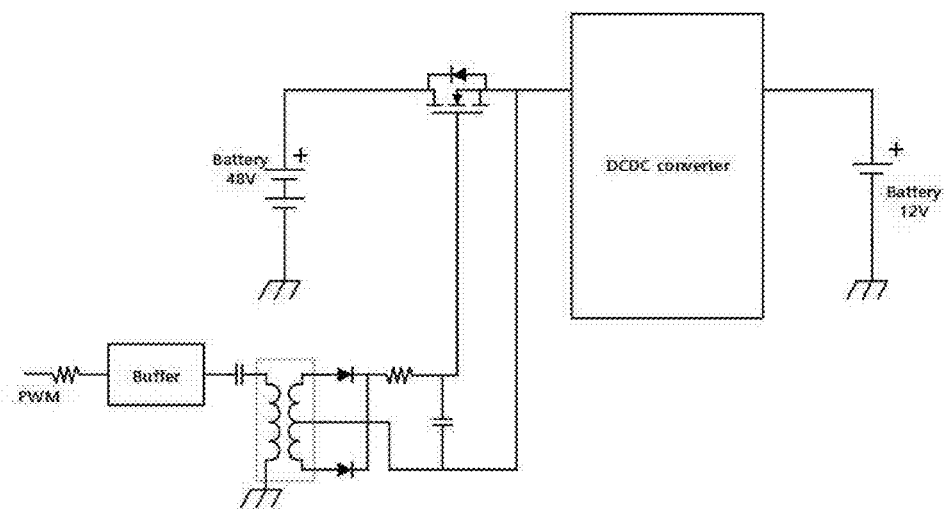
FIG. 1 illustrates a battery switch driving circuit according to a comparative embodiment of the present invention.
Figure 2:
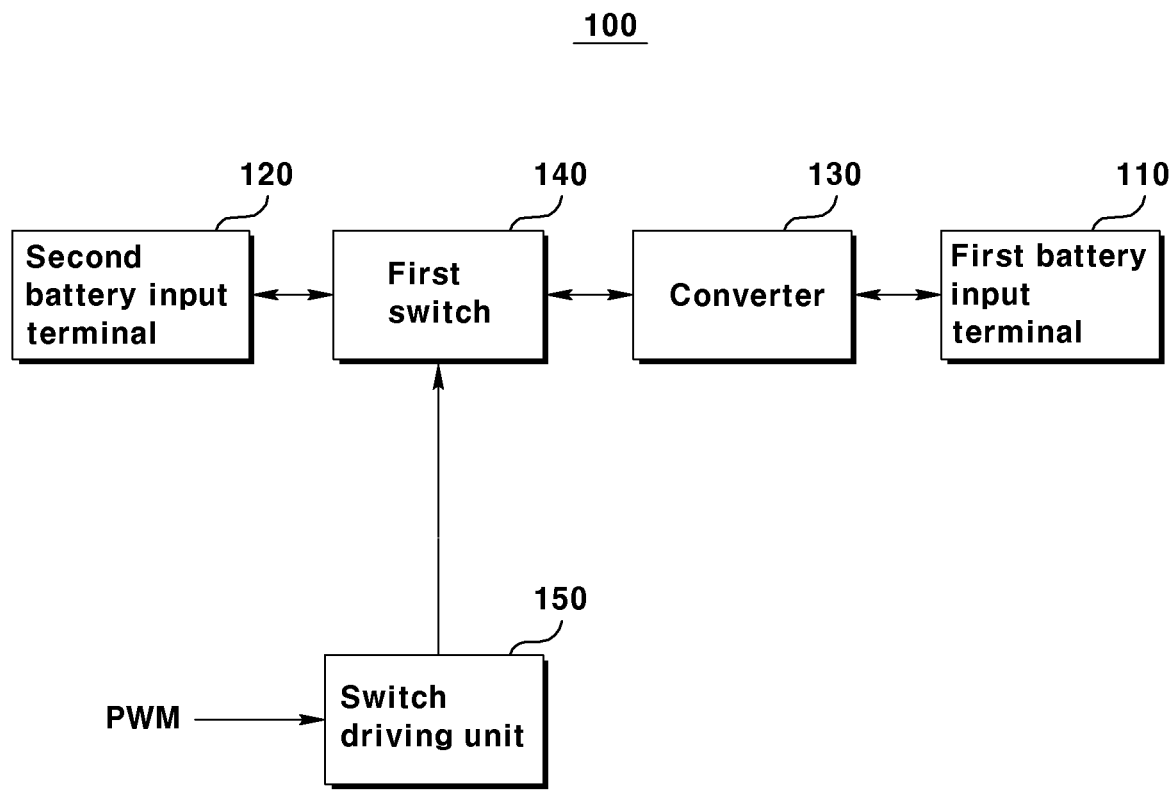
FIG. 2 is a block diagram of a battery switch driving circuit according to an embodiment of the present invention.

FIG. 2 is a block diagram of a battery switch driving circuit according to an embodiment of the present invention.

The battery switch driving circuit 100 according to an embodiment of the present invention comprises a first battery input terminal 110, a second battery input terminal 120, a converter 130, a first switch 140, and a switch driving unit 150, and may include a second switch 151, a first capacitor 152, a second capacitor 153, and resistors and diodes being connected between each component.

The first battery input terminal 110 is connected to a first battery (not shown) having a first battery voltage, and may receive the first battery voltage or output a voltage to the first battery to charge the first battery. The second battery input terminal 120 is connected to a second battery (not shown) having a second battery voltage that is different from that of the first battery input terminal 110, and receives the second battery voltage or may charge the second battery by outputting a voltage to the second battery. Here, the first battery may be a low voltage battery, for example a 12 V battery, and the first battery may be a high voltage battery, for example a 48 V battery. Or, the first battery may be a high voltage battery and the second battery is a low voltage battery, or may be batteries of the same voltage.

The converter 130 is located between the first battery input terminal 110 and the second battery input terminal 120, converts the first battery voltage being inputted to the first battery input terminal 110 into a second battery voltage to output it to the second battery input terminal 120, or may convert the second battery voltage being inputted to the second battery input terminal 120 into a first battery voltage to output it to the first battery input terminal 110. The converter 130 may be a bi-directional converter being configured with a plurality of switches and an inductor, and may perform charging between different batteries through the converter.

The first switch 140 is located between the second battery input terminal and the converter, and blocks power input of the second battery input terminal 120 when turned off. The second battery voltage connected to the second battery input terminal 120 may be greater than the first battery voltage connected to the first battery input terminal 110, and the second battery voltage is received and converted into the first battery voltage through the converter 130 to charge the first battery connected to the first battery input terminal 110 or may supply power to devices receiving power from the first battery. In a situation where the second battery voltage is input and used, the first switch 140 is turned on, and other than that, the first switch 140 is turned off so that the second battery voltage is not applied to the first battery. When the first switch 140 is turned off, power input of the second battery input terminal 120 may be released from blocking.

The switch driving unit 150 turns a first switch 140 on. In order to turn the first switch 140 on and off, driving power must be supplied to the first switch 140, and the switch driving unit 150 supplies driving power to the first switch 140 to turn it on.

Figure 3:
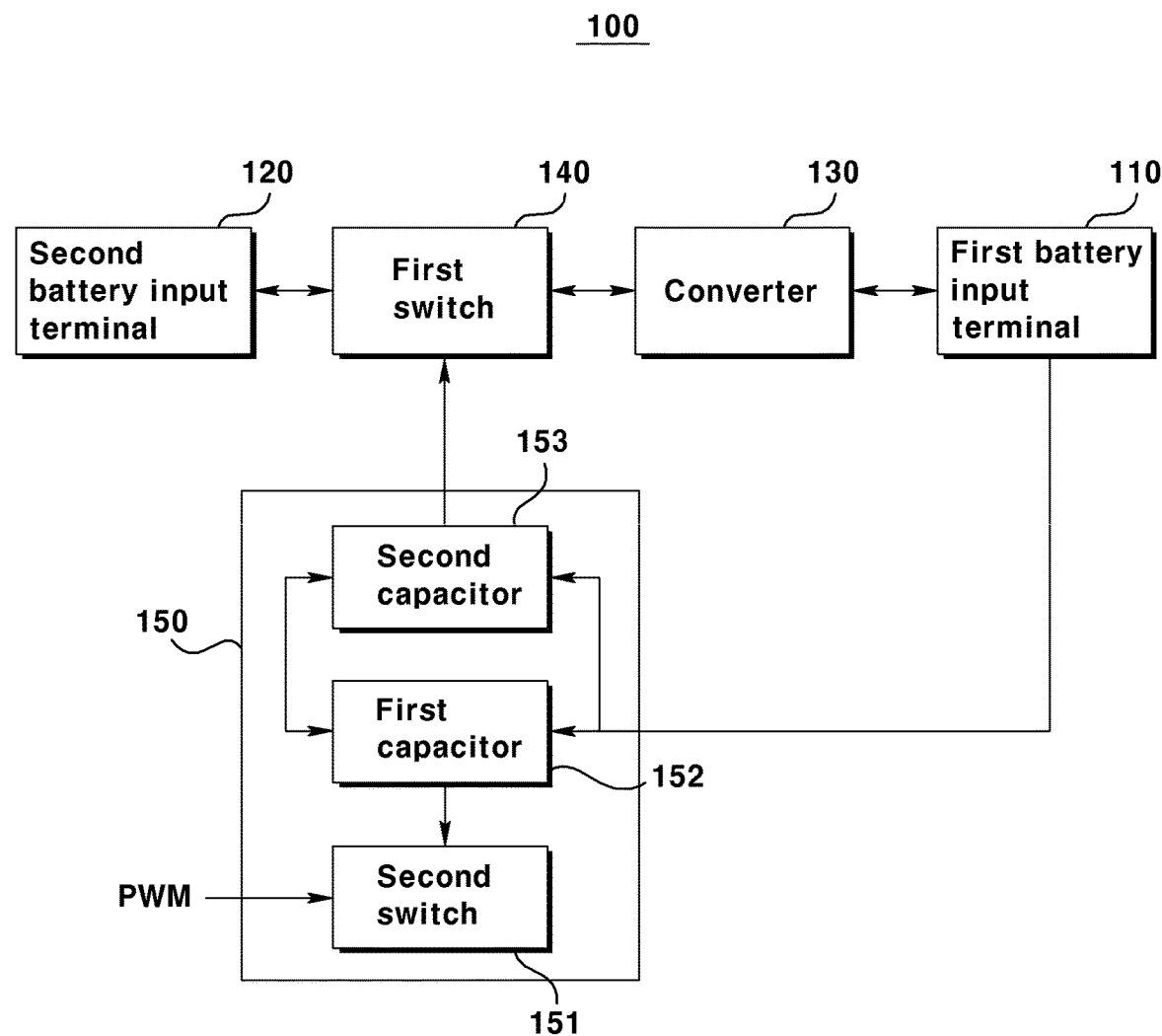
FIG. 3 is a block diagram of a battery switch driving circuit according to an embodiment of the present invention.

As shown in FIG. 3, the switch driver may comprise a second switch 151, a first capacitor 152, and a second capacitor 153. It may include a first capacitor 152 being charged and discharged according to the on-off of the second switch 151 being operated with a PWM signal, and a second capacitor 153 being charged according to the on-off of the second switch 151 by the voltage being charged in the first capacitor 152.

One end of the first capacitor 152 is connected to the first battery input terminal 110 and the other end thereof may be connected to the second switch 151. When the second switch 151 is turned on by a PWM signal, a path through which current flows to the first battery input terminal 110, the first capacitor 152, and the second switch 151 is connected so that the first capacitor 152 may be charged by current flowing from the first battery input terminal 110. Here, the first capacitor 152 may be connected to the first battery input terminal 110 through a first resistor R1 and a first diode D1. A current may be allowed to flow through the first resistor R1, and current may be inhibited from flowing in a reverse direction when the second switch 151 is turned off through the first diode D1.

One end the first capacitor 152 is connected to one end of the second capacitor 153 and the other end thereof may be connected to the other end of the second capacitor 153. When the second switch 151 is turned off by a PWM signal, the path through which current flows through the second switch 151 is disconnected, and the first capacitor 152 and the second capacitor 153 form a closed loop with each other. Through this, the voltage charged in the first capacitor 152 charges the second capacitor 153. Here, the other end of the first capacitor 152 is connected to the other end of the second capacitor 153 through a second resistor R2 and a second diode D2, and one end of the first capacitor 152 may be connected to one end of the second capacitor 153 through a third resistor RG and a third diode D3. A current may flow through the second resistor R2 and the third resistor RG, and a current may flow in a direction in which the first capacitor 152 charges the second capacitor 153 through the second diode D2 and the third diode D3.

The first switch 140 may be a MOSFET, one end of the second capacitor 153 is connected to the gate of the first switch 140 and the other end thereof is connected to the source so that the first switch 140 may be turned on when it is charged above the gate threshold value of the first switch 140. Both ends of the second capacitor 153 may be connected to the gate terminal and the source terminal of the first switch 140, respectively. That is, the voltage being charged in the second capacitor 153 becomes the gate-source voltage of the first switch 140. The first switch 140 is turned on when the gate-source voltage exceeds the threshold value so that the first switch 140 is turned on when the voltage being charged in the second capacitor 153 exceeds the threshold value.

As described above, since the battery switch can be driven using only the switch, capacitor, diode, and resistor, a battery switch driving circuit advantageous in terms of price and size can be implemented.

Figure 4:
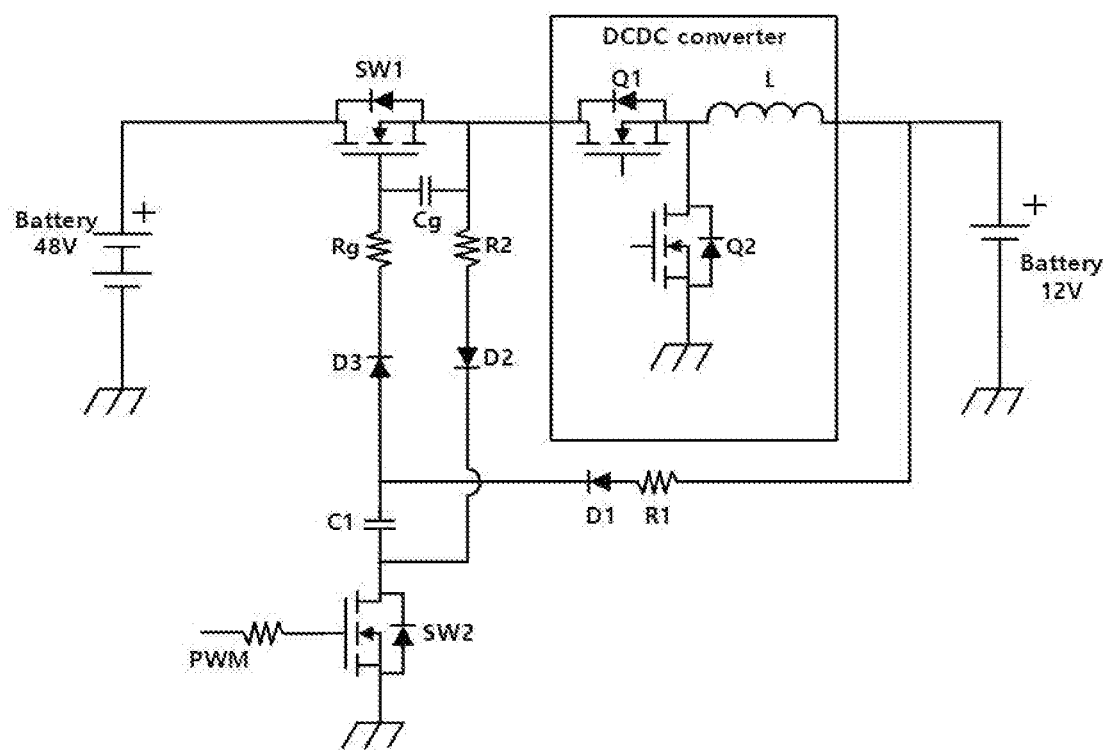
FIG. 4 is a circuit diagram of a battery switch driving circuit according to an embodiment of the present invention.

FIG. 4 is a circuit diagram of a battery switch driving circuit according to an embodiment of the present invention. A 12 V battery may be connected to the first battery input terminal, and a 48 V battery may be connected to the second battery input terminal. The converter may be a DC-DC converter and may be a bi-directional converter formed of two switches Q1 and Q2 and an inductor L. The first switch SW1 is formed between the 48 V battery and the DC-DC converter. The switch driver driving the first switch SW1, as shown in FIG. 4, may comprise: a first capacitor C1 being connected to a 12 V battery through a second switch SW2 operated by a PWM signal, a first resistor R1 and a first diode D1; and a second capacitor CG having both ends connected to the first capacitor C1. The first capacitor C1 and the second capacitor CG may be connected through the second resistor R2 and the second diode D2, the third resistor RG, and the second diode D3. Both ends of the second capacitor CG may be connected to the gate and source of the first switch SW1 and the other end of the second capacitor 153 may be connected to a DC-DC converter.

Figure 5:
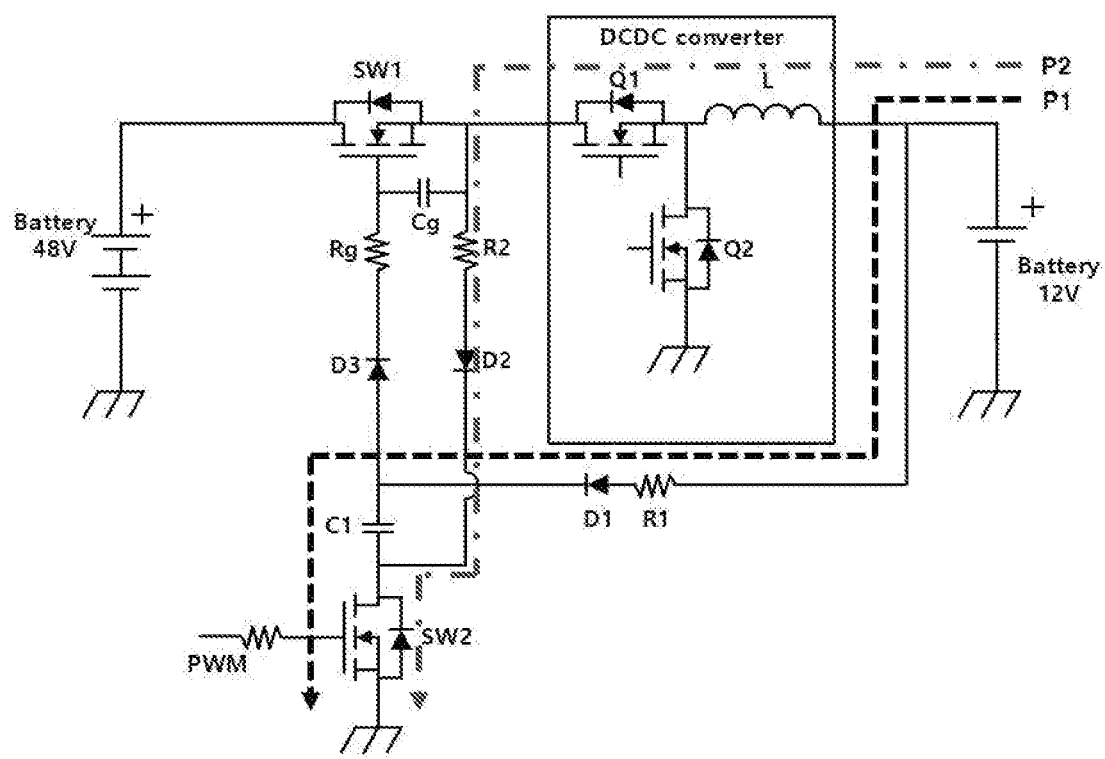
FIGS. 5 to 8 are diagrams for explaining the operation of the embodiment of FIG. 4.
Figure 6:
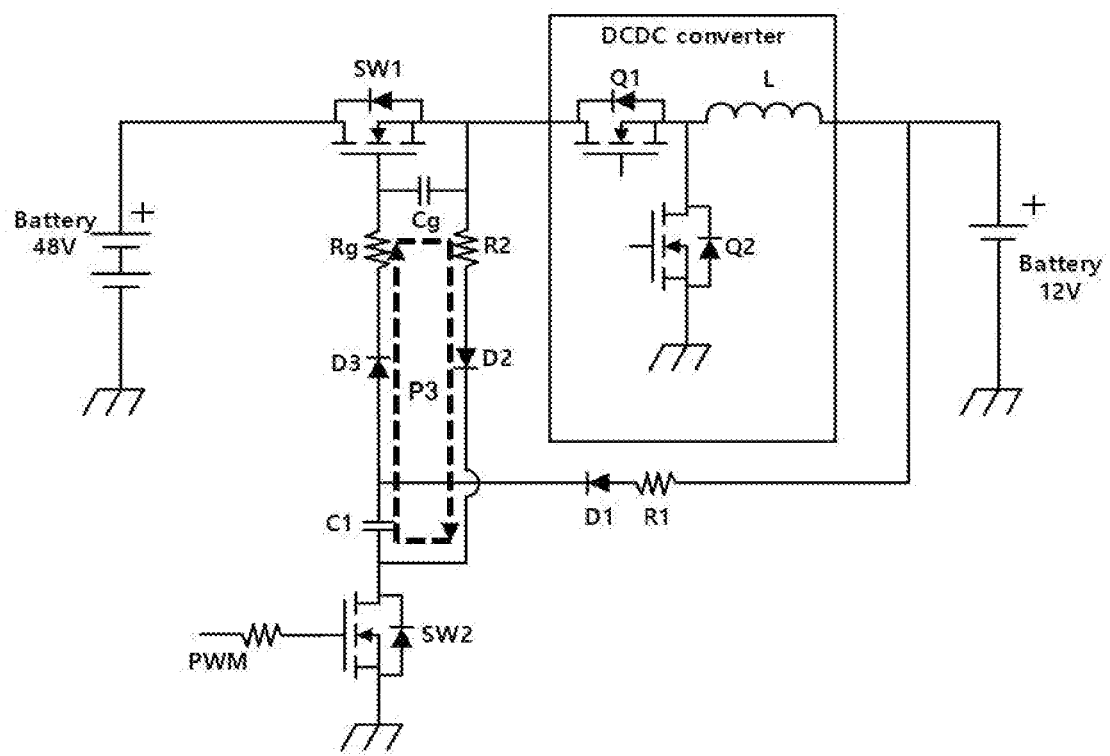

The battery switch driving circuit of FIG. 4 may operate as shown in FIGS. 5 and 6 according to a PWM signal.

In the state where the first switch SW1 is off, 12 V battery voltage $12V_{battery}$ is applied to the source of the first switch SW1 through Q1 and L of the DC-DC converter, so that the source voltage of the first switch SW1 becomes $12V_{battery} - V_{f,Q1}$. When a PWM signal is applied to the gate of the second switch SW2 to turn the first switch SW1 on, the second switch SW2 repeats on/off.

When the second switch SW2 is turned on by a PWM signal, the 12V battery voltage $12V_{battery}$ charges the first capacitor C1 through the first diode D1, the first resistor R1, and path P1. At this time, the voltage of the first capacitor $V_{C1}$ rises as follows.

$$V_{C1} = (12\ V_{battery} - V_{f,Q1})\left(1 - e^{-\frac{1}{R1C1}t}\right) \quad \text{Equation 1}$$

In addition, the leakage current flows through L and Q1 of the DC-DC converter, the second resistor R2, the second diode D2, the second switch SW2, and path P2 as shown in the following equation, and since this value is a loss, the value of the second resistor R2 should be selected with an appropriately large value.

$$I_{leakage} = (12V_{battery} - V_{f,D2} - V_{f,Q1})/(R_{L,DCR} + R_{SW2,RDC} + R2) \quad \text{Equation 2}$$

Here, the size of the second resistor R2 may be set according to an allowable leakage current allowed by the battery device or system, and may be set by a user. The second resistor R2 may have a larger size than the first resistor R1 and the third resistor RG.

As shown in FIG. 6, when the second switch SW2 is turned off by a PWM signal, the voltage of the first capacitor C1 is greater than the 12 V battery voltage and the first diode D1 is turned off.

$$V_{C1-GND} = V_{C1,charged} + (12V_{battery} - V_{f,D2} - V_{f,Q1}) \quad \text{Equation 3}$$

The voltage charged in the first capacitor C1 charges the second capacitor CG through the third diode D3, the third resistor RG, the second capacitor RG, the first resistor R2, the second diode D2, and the path P3, and a voltage is charged in the second capacitor CG to turn the first switch SW1 on.

When the second switch SW2 repeats on/off by a PWM signal, the first capacitor C1 is charged while the second switch SW2 is turned on; the gate voltage of the first switch SW1 rises by charging the second capacitor CG with the voltage charged in the first capacitor C1 when the second switch SW2 is off; and as a result, the voltage across the second capacitor CG becomes as follows.

$$V_{Cg} = (12V_{battery} - V_{f,D1}) - V_{f,D2} - V_{f,D3} \quad \text{Equation 4}$$

When the voltage across the second capacitor CG exceeds the threshold value of the gate of the first switch SW1, the first switch SW1 is turned on, and the source voltage of the first switch SW1 rises to 48 V battery voltage from 12 V battery voltage.

Figure 7:
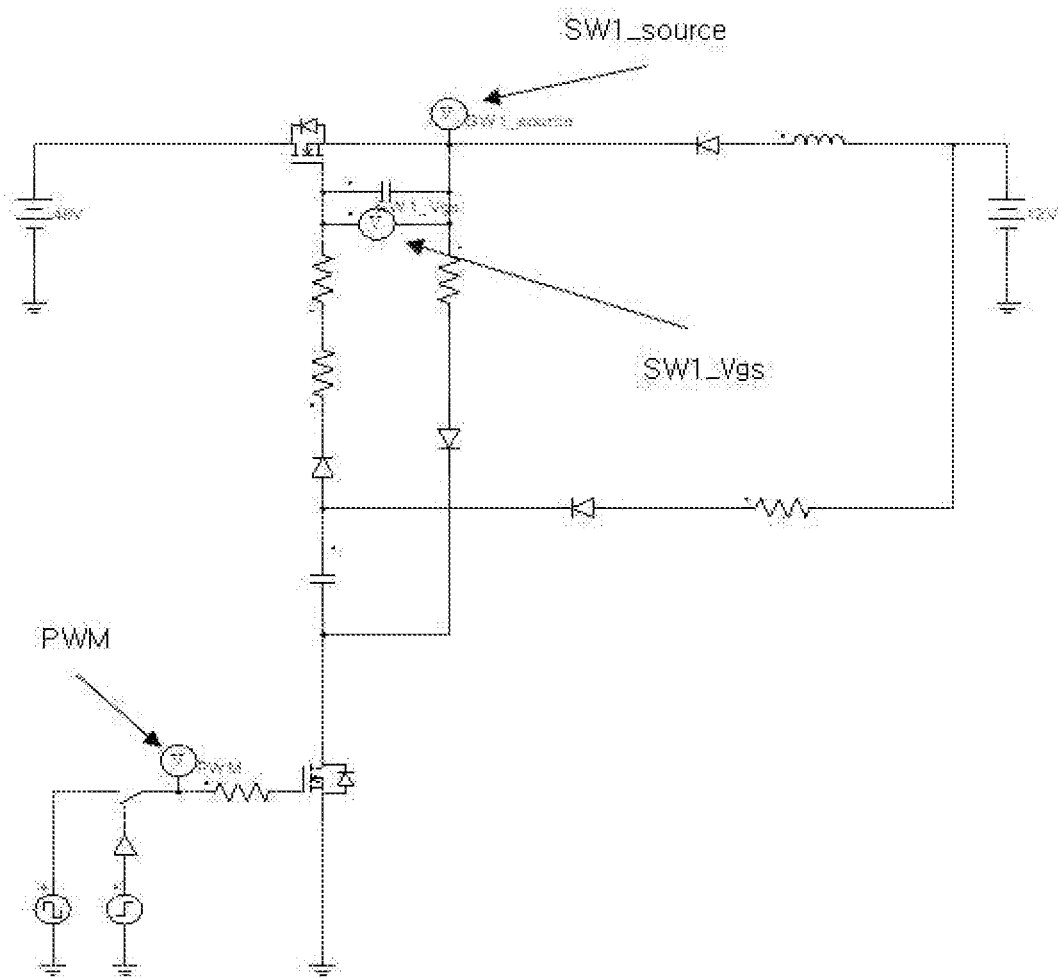
Figure 8:
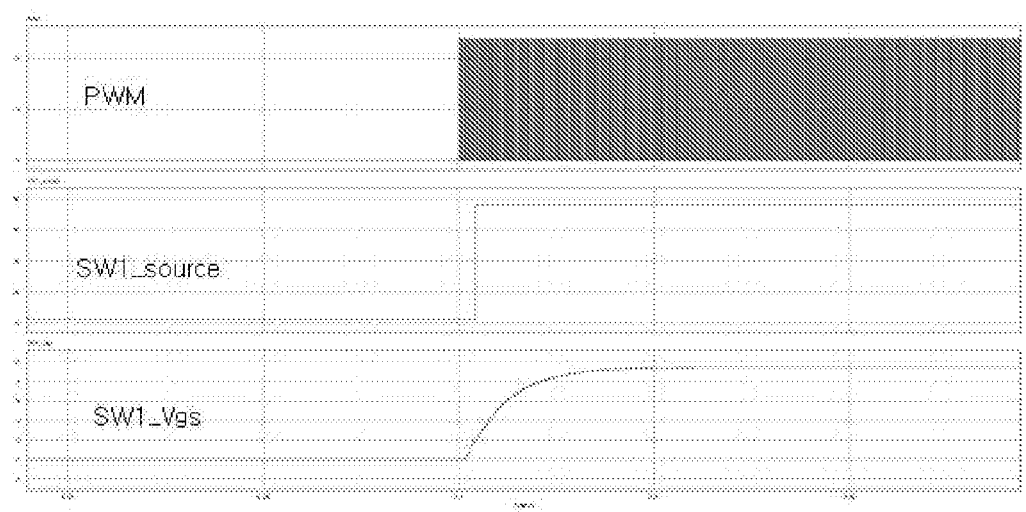

FIG. 7 is a circuit in which simulation of FIG. 4 is performed, and FIG. 8 shows the result of the simulation. As a result of the simulation, when a PWM signal is applied and the gate-source voltage $SW1\_V_{gs}$ of the first switch SW1 starts to be charged, and the voltage exceeds the threshold value of the gate of the first switch SW1 to turn the first switch SW1 on and it can be confirmed that the source voltage SW1$_{SOURCE}$ of the first switch SW1 rises from the 12 V battery voltage to the 48 V battery voltage.

The first switch 140, located between the first battery input terminal 110 and the converter 130 and blocking the power input of the second battery input terminal 120 when off, is located between the first battery input terminal 110 and the converter 130 instead, may include a fourth switch and a fifth switch that block power input in opposite directions when turned off may be included. At this time, the switch driver 150 may turn on the fourth switch and the fifth switch. The switch structure can be implemented as a back-to-back structure by using the fourth switch and the fifth switch capable of blocking bi-directional power input instead of the first switch 140. Here, the back-to-back structure means a structure that blocks bi-directional signal input. The second capacitor 153 of the switch driver 150 is connected to the gate and drain of the back-to-back structure switch being formed of the fourth switch and the fifth switch, and as described above, the fourth switch and the fifth switch may be turned on.

Figure 9:
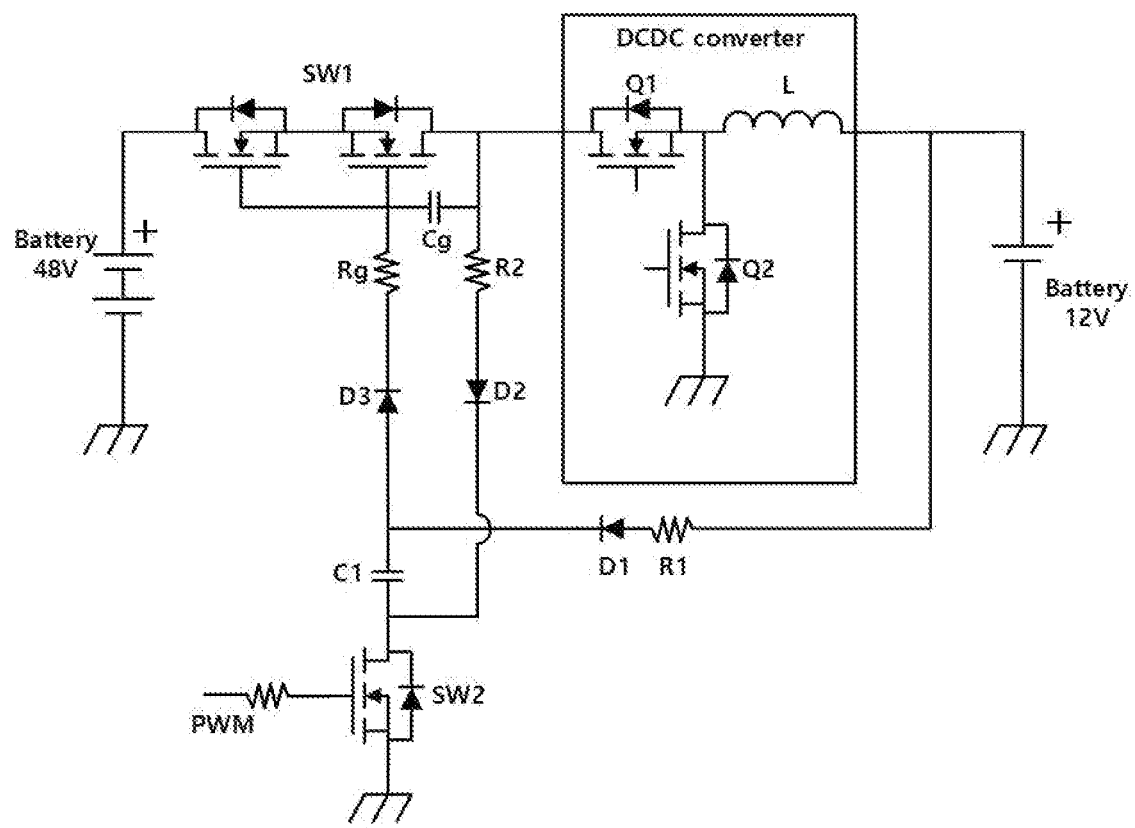
FIG. 9 is a circuit diagram of a battery switch driving circuit according to another embodiment of the present invention.

FIG. 9 is a circuit diagram of a battery switch driving circuit according to another embodiment of the present invention. A battery switch can be implemented in a back-to-back structure by connecting two switches in opposite directions. In the battery switch driving circuit of FIG. 9, as in the battery switch driving circuit of FIG. 4, when a PWM signal is applied to the second switch SW2, the first capacitor C1 is charged, and the second capacitor CG is charged so that the fourth and fifth switches are turned on and operate.

Figure 10:
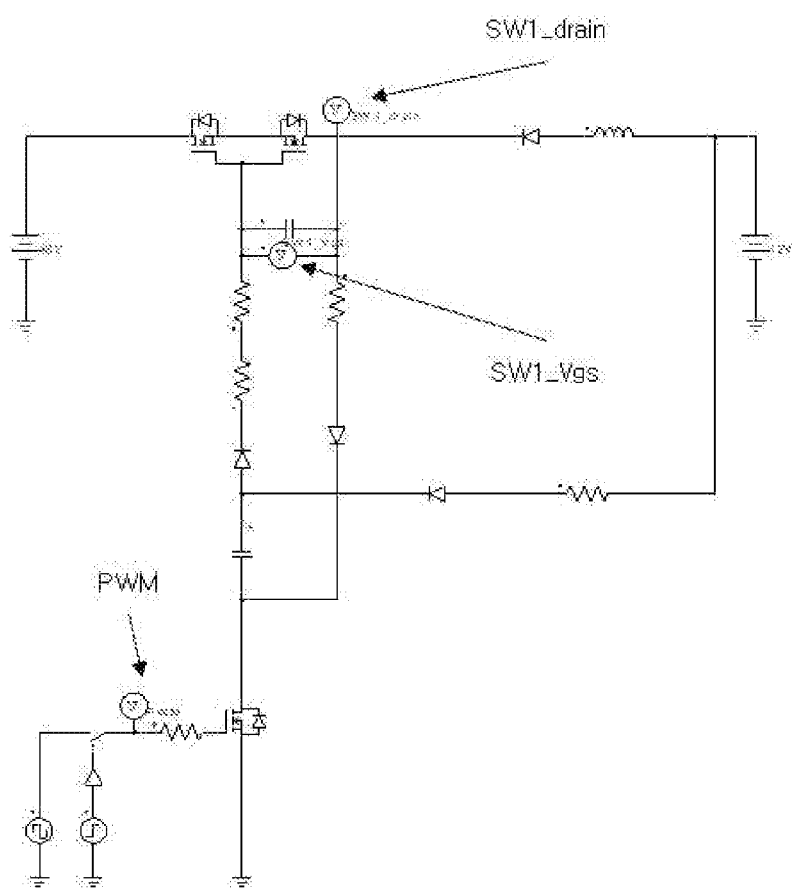
FIGS. 10 and 11 are diagrams for explaining the operation of the embodiment of FIG. 9.
Figure 11:
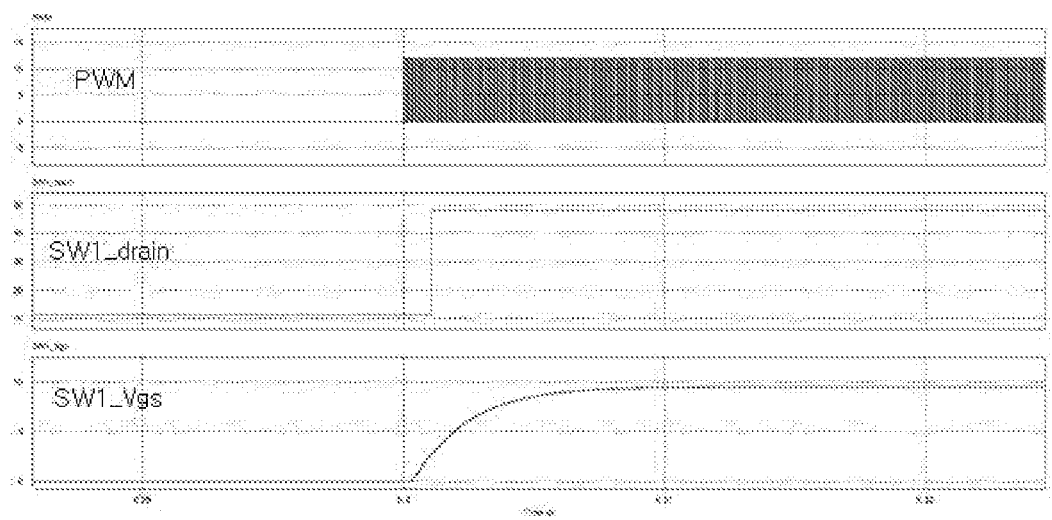

FIG. 10 is a circuit in which simulation of FIG. 9 is performed, and FIG. 11 shows a result of the simulation. As the result of the simulation, a PWM signal is applied, and the gate-source voltage SW1_V$_{GS}$ of the switch SW1 of the back-to-back structure of the fourth switch and the fifth switch starts to be charged, and when the voltage exceeds the threshold value of the gate of the first switch SW1, the first switch SW1 is turned on, and it can be confirmed that the drain voltage SW1$_{DRAIN}$ of the first switch SW1 rises from the 12 V battery voltage to the 48 V battery voltage.

In order to turn off the first switch SW1 while the first switch SW1 is on, the voltage charged in the second capacitor CG must be discharged, so a switch-off circuit may be included to quickly turn off the first switch SW1 in an emergency situation or the like.

To this end, it is connected to the first battery input terminal through an optocoupler and a fourth resistor R3 and includes a third switch SW3 which is turned on and off according to the off signal of the first switch, the optocoupler forms a closed loop with the second capacitor 153, and the voltage of the second capacitor 153 can be discharged as it is operated when the third switch SW3 is turned on. Here, the optocoupler is a switch operated by light, and is composed of a light emitting diode that emits light when current flows and a switch that is turned on by light emitted from the light emitting diode. When the first switch-off signal is applied to the gate of the third switch SW3, the third switch SW3 is turned on and light is emitted from the light emitting diode of the optocoupler to operate the optocoupler, and the voltage charged in the second capacitor 153 is quickly discharged by forming a closed loop with the second capacitor 153 to quickly turn the first switch 140 on.

FIG. 2 is a circuit diagram of a battery switch driving circuit according to another embodiment of the present invention, which can quickly turn on and off the first switch SW1. The battery switch driving circuit of FIG. 12 operates like the battery switch driving circuit of FIG. 4 when the first switch SW1 is turned on, but when the first switch SW1 is turned off, a switch-off circuit is driven as shown in FIG. 13. When the first switch-off signal SWITCH-OFF is applied to the third switch SW3, the third switch SW3 is turned on, and the optocoupler is turned on by the 12 V battery voltage, the light emitting diode of the optocoupler, the fourth resistor R3, and the path P4. The third resistor RG may include a fifth resistor RG1 and a sixth resistor RG2, and when the optocoupler is turned on, the second capacitor CG is quickly discharged by the optocoupler, the fifth resistor RG1, the second capacitor CG, and the path P5, and accordingly, the first switch SW1 is quickly turned off. Here, the voltage of the second capacitor CG being discharged is as follows.

$$V_{Cg} = (12\ V_{battery} - V_{f,D1} - V_{f,D2} - V_{f,D3})e^{-\frac{1}{C_gR_g1}t} \quad \text{Equation 5}$$

Figure 12:
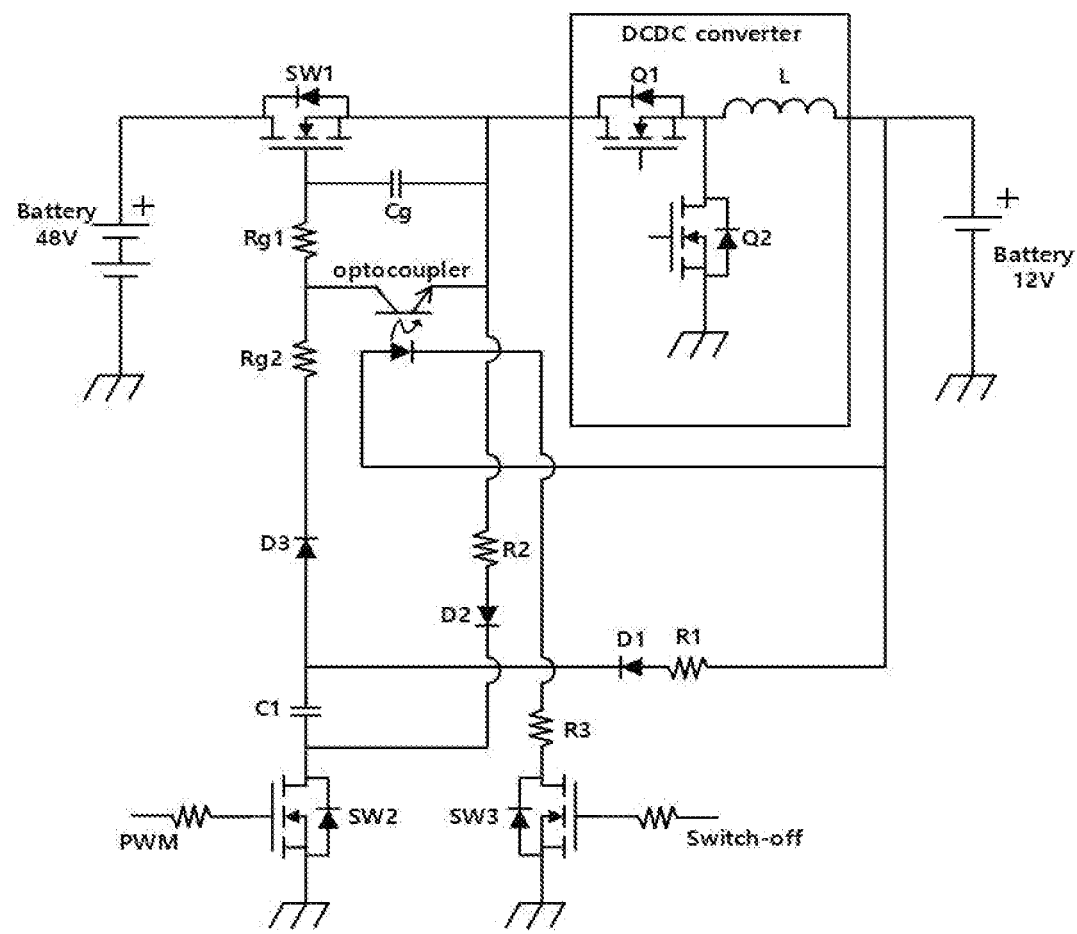
FIG. 12 is a circuit diagram of a battery switch driving circuit according to another embodiment of the present invention.
Figure 13:
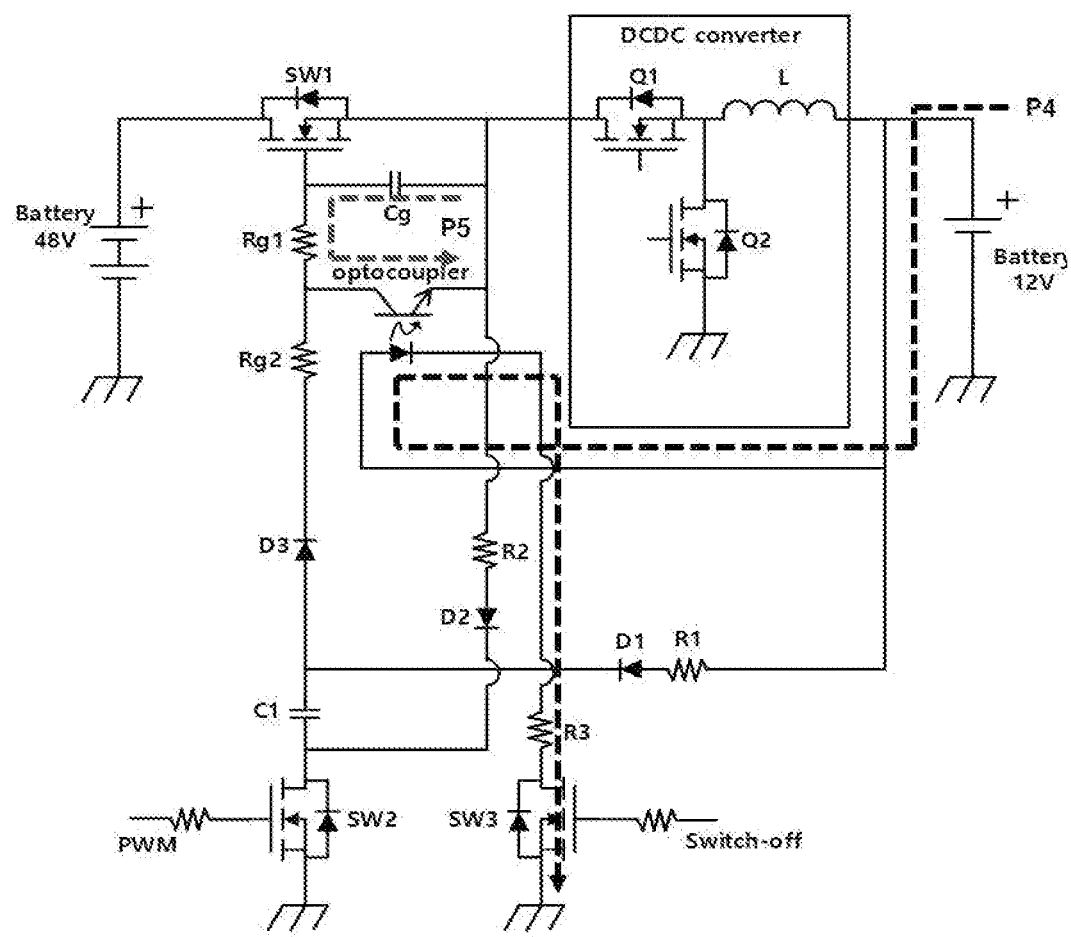
FIGS. 13 to 15 are views for explaining the operation of the embodiment of FIG. 12.
Figure 14:
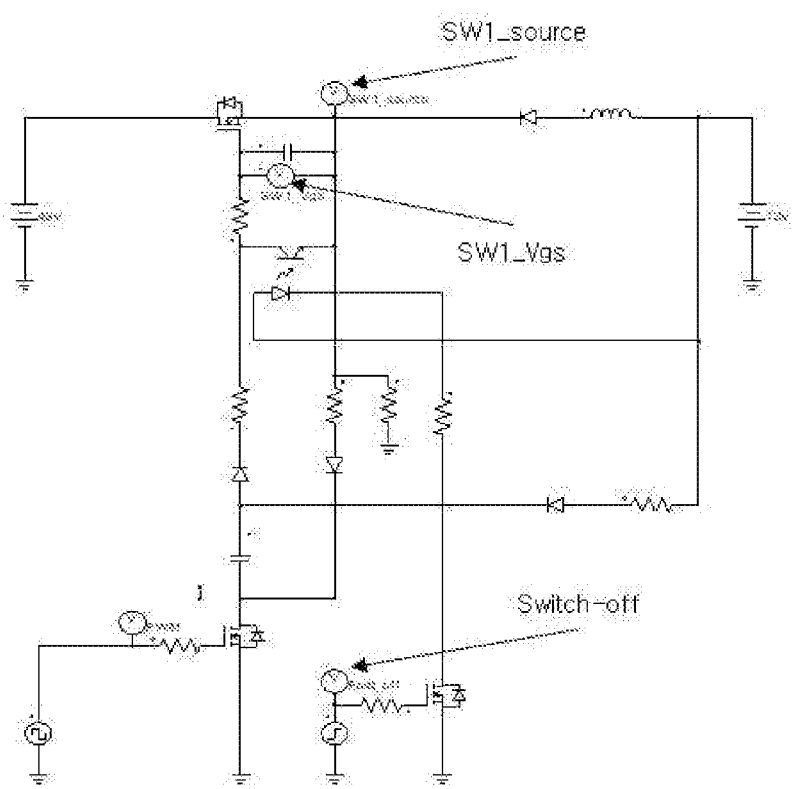
Figure 15:
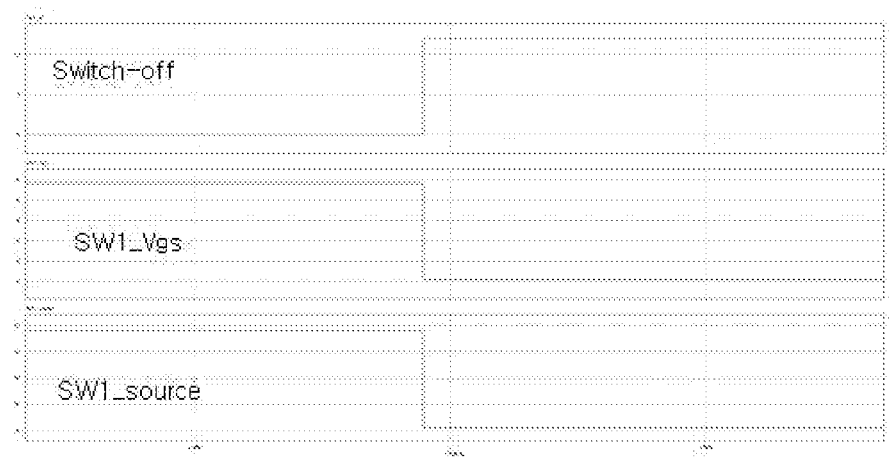

FIG. 14 is a circuit in which simulation of FIG. 12 is performed, and FIG. 15 illustrates the result of the simulation. As the result of the simulation, when the first switch-off signal SWITCH-OFF is applied and the third switch is turned on, the optocoupler is turned on, and the gate-source voltage SW1_V$_{GS}$ of the first switch SW1 starts to discharge, and the first switch SW1 is turned off when the voltage is less than the threshold value of the gate of the first switch SW1, and it can be confirmed that the source voltage SW1_SOURCE of the first switch SW1 drops from the 48 V battery voltage to the 12 V battery voltage.

As described above, the high side switch can be turned on and off by implementing a battery switch driving circuit with capacitors, diodes, resistors, and switches. In addition, the switch configured in back-to-back can be turned on and off by using another battery switch driving circuit according to the embodiment of the present invention, and other than this, various types of semiconductor switches (FET, IGBT, etc.) can be turned on and off. In addition, the battery switch can be quickly turned off through the switch-off circuit.

Those skilled in the art related to the present embodiment will be able to understand that it can be implemented in a modified form within a range that does not deviate from the essential characteristics of the above description. Therefore, the disclosed methods are to be considered in an illustrative rather than a limiting sense. The scope of the present invention is shown in the claims rather than the foregoing description, and all differences within the equivalent scope will be construed as being included in the present invention.

We claim:

1. A battery switch driving circuit comprising:
    a first battery input terminal and a second battery input terminal;
    a converter positioned between the first battery input terminal and the second battery input terminal;
    a first switch positioned between the second battery input terminal and the converter, configured to cut off a power input of the second battery input terminal when turned off; and
    a switch driving unit configured to turn on the first switch, wherein the switch driving unit comprises:
    a first capacitor charged or discharged according to on/off of a second switch operated by a PWM signal; and
    a second capacitor charged according to on/off of the second switch by a voltage charged in the first capacitor, and configured to turn on the first switch, and wherein one end of the first capacitor is connected to one end of the second capacitor and an other end of the first capacitor is connected to an other end of the second capacitor.

2. The battery switch driving circuit according to claim 1, wherein the one end of the first capacitor is connected to the first battery input terminal and the other end of the first capacitor is connected to the second switch.

3. The battery switch driving circuit according to claim 2, wherein the first capacitor is connected to the first battery input terminal through a first resistor and a first diode.

4. The battery switch driving circuit according to claim 1, wherein the other end of the first capacitor is connected to the other end of the second capacitor through a second resistor and a second diode.

5. The battery switch driving circuit according to claim 4, wherein the one end of the first capacitor is connected to the one end of the second capacitor through a third resistor and a third diode.

6. The battery switch driving circuit according to claim 1, wherein the one end of the second capacitor is connected to a gate of the first switch and the other end of the second capacitor is connected to a source, and
wherein the first switch is turned on when it is charged above a gate threshold value of the first switch.

7. The battery switch driving circuit according to claim 1, comprising:
a third switch connected to the first battery input terminal through an optocoupler and a fourth resistor, and turned on and off according to an off signal of the first switch.

8. The battery switch driving circuit according to claim 7, wherein the optocoupler forms a closed loop with the second capacitor and operates when the third switch is turned on, so that the voltage of the second capacitor is discharged.

9. A battery switch driving circuit comprising:
a first battery input terminal and a second battery input terminal;
a converter positioned between the first battery input terminal and the second battery input terminal;
a fourth switch and a fifth switch positioned between the second battery input terminal and the converter, and configured to block power input in opposite directions when turned off; and
a switch driving unit configured to turn on the fourth switch and the fifth switch,
wherein the switch driving unit comprises:
a first capacitor charged and discharged according to on/off of a second switch operated by a PWM signal; and
a second capacitor charged according to on/off of the second switch by voltage charged in the first capacitor, and configured to turn on the fourth switch or the fifth switch, and
wherein one end of the first capacitor is connected to one end of the second capacitor and an other end of the first capacitor is connected to an other end of the second capacitor.

10. The battery switch driving circuit according to claim 9, wherein the one end of the first capacitor is connected to the first battery input terminal and the other end of the first capacitor is connected to the second switch.

11. The battery switch driving circuit according to claim 10, wherein the first capacitor is connected to the first battery input terminal through a first resistor and a first diode.

12. The battery switch driving circuit according to claim 9, wherein the other end of the first capacitor is connected to the other end of the second capacitor through a second resistor and a second diode.

13. The battery switch driving circuit according to claim 9, wherein the one end of the first capacitor is connected to the one end of the second capacitor through a third resistor and a third diode.

14. The battery switch driving circuit according to claim 9, wherein the one end of the second capacitor is connected to a gate of the fourth switch and the other end of the second capacitor is connected to a source, and
wherein the fourth switch is turned on when it is charged above a gate threshold value of the fourth switch.

15. The battery switch driving circuit according to claim 9, comprising:
a third switch connected to the first battery input terminal through an optocoupler and a fourth resistor, and turned on and off according to an off signal of the fourth switch.

16. The battery switch driving circuit according to claim 15, wherein the optocoupler forms a closed loop with the second capacitor and operates when the third switch is turned on, so that the voltage of the second capacitor is discharged.

* * * * *